United States Patent [19]

Hirao et al.

[11] Patent Number: 5,675,207

[45] Date of Patent: Oct. 7, 1997

[54] SURFACE ACOUSTIC WAVER CONVOLVER

[75] Inventors: Yasuhiro Hirao; Kuniyuki Matsui; Yasumi Kobayashi; Kousuke Takeuchi, all of Osaka-fu; Kenichi Shibata, Wakayama-ken, all of Japan

[73] Assignee: Sanyo Electric Co., Ltd., Moriguchi, Japan

[21] Appl. No.: 650,257

[22] Filed: May 22, 1996

Related U.S. Application Data

[63] Continuation of Ser. No. 357,385, Dec. 16, 1994, abandoned.

[30] Foreign Application Priority Data

Dec. 21, 1993 [JP] Japan ................................. 5-321541

[51] Int. Cl.⁶ ............................................ H03H 9/72
[52] U.S. Cl. ........................................ 310/313 D; 364/821
[58] Field of Search .......................... 310/313 R, 313 D; 364/821

[56] References Cited

U.S. PATENT DOCUMENTS 4,428,062  1/1984  Michaels ............................. 364/821
4,448,805  5/1984  Lewis ............................. 310/313 R
5,164,628  11/1992  Egara et al. ............................. 364/821

FOREIGN PATENT DOCUMENTS 4022208  1/1992  Japan ............................. 310/313 R Primary Examiner—Thomas M. Dougherty
Attorney, Agent, or Firm—Armstrong, Westerman Hattori, McLeland & Naughton

[57] ABSTRACT

A surface acoustic wave convolver of the present invention includes, on a surface of a piezoelectric substrate, a pair of comb-like surface acoustic wave excitation electrodes 2 and 3, and a center electrode 4. The excitation electrodes 2 and 3 are disposed opposed to each other at a specified interval while the center electrode 4 having a shorter width than a length of the excitation electrodes 2 and 3 is positioned between the electrodes 2 and 3. The center electrode 4 propagates the surface acoustic waves respectively produced by the excitation electrodes 2 and 3 in reverse directions to each other to obtain a convolution output signal. A pair of reflectors 10 are positioned on opposite sides of a region defined between the excitation electrode 2 and one end of the center electrode 4 with a width equivalent to that of the center electrode 4. Also, a pair of reflectors 11 are positioned on opposite sides of a region defined between the excitation electrode 3 and the other end of the center electrode 4 with a width equivalent to that of the center electrode 4.

23 Claims, 8 Drawing Sheets

SURFACE ACOUSTIC WAVER CONVOLVER

This application is a continuation of application Ser. No. 08/357,385 filed Dec. 16, 1994, now abandoned.

BACKGROUND OF THE INVENTION

The present invention relates to a surface acoustic wave convolver which utilizes a physical nonlinear effect of a substrate to obtain a convolution signal of two surface acoustic wave signals propagating in reverse directions to each other.

DESCRIPTION OF THE PRIOR ART

FIG. 4 is a schematic plan view showing a prior art surface acoustic wave convolver. A pair of surface acoustic wave excitation electrodes 2 and 3 respectively consisting of a comb-like electrode are disposed opposed to each other at a specified interval on a piezoelectric substrate 1. A center electrode 4 is formed between the electrodes 2 and 3.

The center electrode 4 propagates surface acoustic waves respectively produced from the excitation electrodes 2 and 3 in reverse directions to each other and obtains a convolution output signal.

When a signal $F(t)e^{jwt}$ is applied to the excitation electrode 2 while a signal $G(t)e^{jwt}$ is applied to the excitation electrode 3, two surface acoustic waves reverse in direction to each other as expressed in the following formulas propagate in surface of the piezoelectric substrate 1:

$$F(t-x/v)e^{jw(t-x/v)}$$

$$G(t-(L-x)/v)e^{jw(t-(L-x)/v)}$$

where v is a velocity of the surface acoustic waves, and L is a length of the center electrode 4.

In the course of propagation, a nonlinear effect permits product components of the surface acoustic waves to arise, and they are integrated in a range of the center electrode 4 and output. This output signal $H(t)$ is expressed as follows:

$$H(t) = \alpha \cdot e^{j2wt} \int F(t-x/v) \cdot G(t-(L-x)/v) dx$$

where $\alpha$ is a proportional constant, and an integration range is from 0 to L.

A surface acoustic wave convolver of which waveguide is split is also well-known. FIG. 5 is a schematic plan view showing the prior art surface acoustic wave convolver using multiple waveguide. A pair of surface acoustic excitation electrodes 2 and 3 respectively consisting of a comb-like electrode are disposed opposed to each other at a specified interval on a piezoelectric substrate 1. A waveguide 5 split into sub-waveguides $5_{-1}, 5_{-2}, \ldots, 5_{-n}$ are arranged at specified intervals from each other on a surface of the piezoelectric substrate 1 between the excitation electrodes 2 and 3. The waveguide 5 is elongated in a direction (X-direction) orthogonal to a longitudinal direction of the excitation electrodes 2 and 3 (Y-direction). An output electrode 6 is formed close to the waveguide $5_{-n}$. The output electrode 6 consists of a comb-like electrode having its elongated extension arranged orthogonal to the longitudinal direction of the excitation electrodes 2 and 3.

In such a surface acoustic wave convolver, applying electric signals of angular frequency ω respectively to the excitation electrodes 2 and 3 permits surface acoustic waves to be excited to propagate in the waveguide 5 in reverse directions to each other, and eventually, due to a parametric mixing phenomenon, surface acoustic wave of angular frequency ω propagating in a direction (Y-direction) orthogonal to an elongated extension of the waveguide 5 (X-direction) is generated. The surface acoustic wave is received at the output electrode 6, and thus, the output electrode 6 obtains a convolution electric signal of the two input signal.

However, the prior art convolver is poor in incident efficiency of surface acoustic wave because all the surface acoustic waves excited toward the center electrode 4 or the waveguide 5 by the excitation electrodes 2 and 3 are not incident upon the center electrode 4 or the waveguides $5_{-1}, 5_{-2}, \ldots, 5_{-n}$.

There has been proposed a surface acoustic wave convolver using multiple waveguide in which a horn-shaped waveguide of which exit width is the same as those of sub-waveguides is provided between excitation electrodes and the sub-waveguides in order to enhance an incident efficiency of surface acoustic wave (see Japanese Unexamined Patent Publication No. 81114/1992).

As shown in FIG. 6, an angle θ made between an incident direction of the surface acoustic waves and a reflection surface of a horn must be 6.5° or smaller because a critical angle with a YZ-LiNbO$_3$ substrate is 13° while there is a requirement that the critical angle be 2θ in FIG. 6.

Thus, the length of the horn-shaped waveguide (L$_1$) is relatively long, which results in an area of the piezoelectric substrate becoming large, and thus, the surface acoustic wave convolver cannot be miniaturized any more. If the horn-shaped wave guide is shortened, a rate of leakage of reflected surface acoustic waves becomes greater, and the incident efficiency of the surface acoustic waves cannot be enhanced any more.

SUMMARY OF THE INVENTION

Accordingly, allowing for the above-mentioned state of the art, it is an object of the present invention to provide a surface acoustic wave convolver in which an incident efficiency of surface acoustic wave can be enhanced while a piezoelectric substrate keeps its area as small as possible without so much cost rising.

The surface acoustic wave convolver according to the present invention is characterized in that there are arranged on the piezoelectric substrate at least two excitation electrodes for exciting surface acoustic waves, an output electrode for detecting the surface acoustic waves from the excitation electrodes to convert a convolution output into an electric signal, and a reflector for reflecting the surface acoustic waves from the excitation electrodes toward the output electrode so that reflected waves are in phase with each other.

Such an arrangement enables the reflector to reflect the surface acoustic waves from the excitation electrodes toward the output electrode, the incident efficiency of the surface acoustic waves upon the output electrode is enhanced, an energy density of the surface acoustic waves is raised, and eventually, a convolution efficiency can be enhanced. In addition to that, since a length of the excitation electrodes can be determined as desired by virtue of the reflector which can change a beam width of the surface acoustic waves, matching of an input impedance is facilitated.

A surface acoustic wave convolver in another aspect of the present invention is characterized in that there are arranged on the piezoelectric substrate at least two excitation electrodes for exciting surface acoustic waves, a plurality of waveguides for propagating the surface acoustic wave from the excitation electrodes in reverse directions to each other, and an output electrode for detecting surface acoustic wave which is generated at the waveguides and propagates traversing the surface acoustic waves to convert it into an electric signal, and a reflector for reflecting the surface acoustic waves from the excitation electrodes toward a region of the waveguides so that the surface acoustic waves are in phase with each other.

Since such an arrangement enables the reflector to reflect the surface acoustic waves from the excitation electrodes toward the region of the waveguides, an incident efficiency of the surface acoustic waves upon the region of the waveguides is enhanced.

The reflector may be oriented so that the surface acoustic waves from the excitation electrodes are directed toward each of the waveguides, and such an arrangement enables the surface acoustic waves from the excitation electrodes to be reflected toward the waveguides by the reflector, the incident efficiency of the surface acoustic waves is further enhanced, compared with the previous arrangement.

A surface acoustic convolver in still another aspect of the present invention is characterized in that there are arranged on a piezoelectric substrate at least two excitation electrodes for exciting surface acoustic waves, a plurality of waveguides for propagating the surface acoustic waves from the excitation electrodes in reverse directions to each other, and an output electrode for detecting surface acoustic wave which is generated at the waveguides and propagates traversing the surface acoustic waves to convert it into an electric signal, and a reflector for reflecting the surface acoustic waves from the waveguides toward the output electrode so that reflected waves are in phase with each other.

Since such an arrangement enables the reflector to reflect the surface acoustic waves from the waveguides toward the output electrode, an incident efficiency of the surface acoustic waves upon the output electrode is enhanced.

Additionally, in any of the above-mentioned arrangements, the reflector may be oriented at a larger angle than an incident angle at which the surface acoustic waves are totally reflected. With such an arrangement, a distance between the excitation electrodes and the output electrode, between the excitation electrodes and the waveguides, or between the waveguides and the output electrode can be shortened, and this brings about miniaturization of the surface acoustic wave convolver.

Although the reflector, when oriented at a larger angle than an incident angle, cannot totally reflect the surface acoustic waves to cause leakage of reflected waves, such a disadvantage can be overcome by increasing the number of reflecting members of the reflector.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
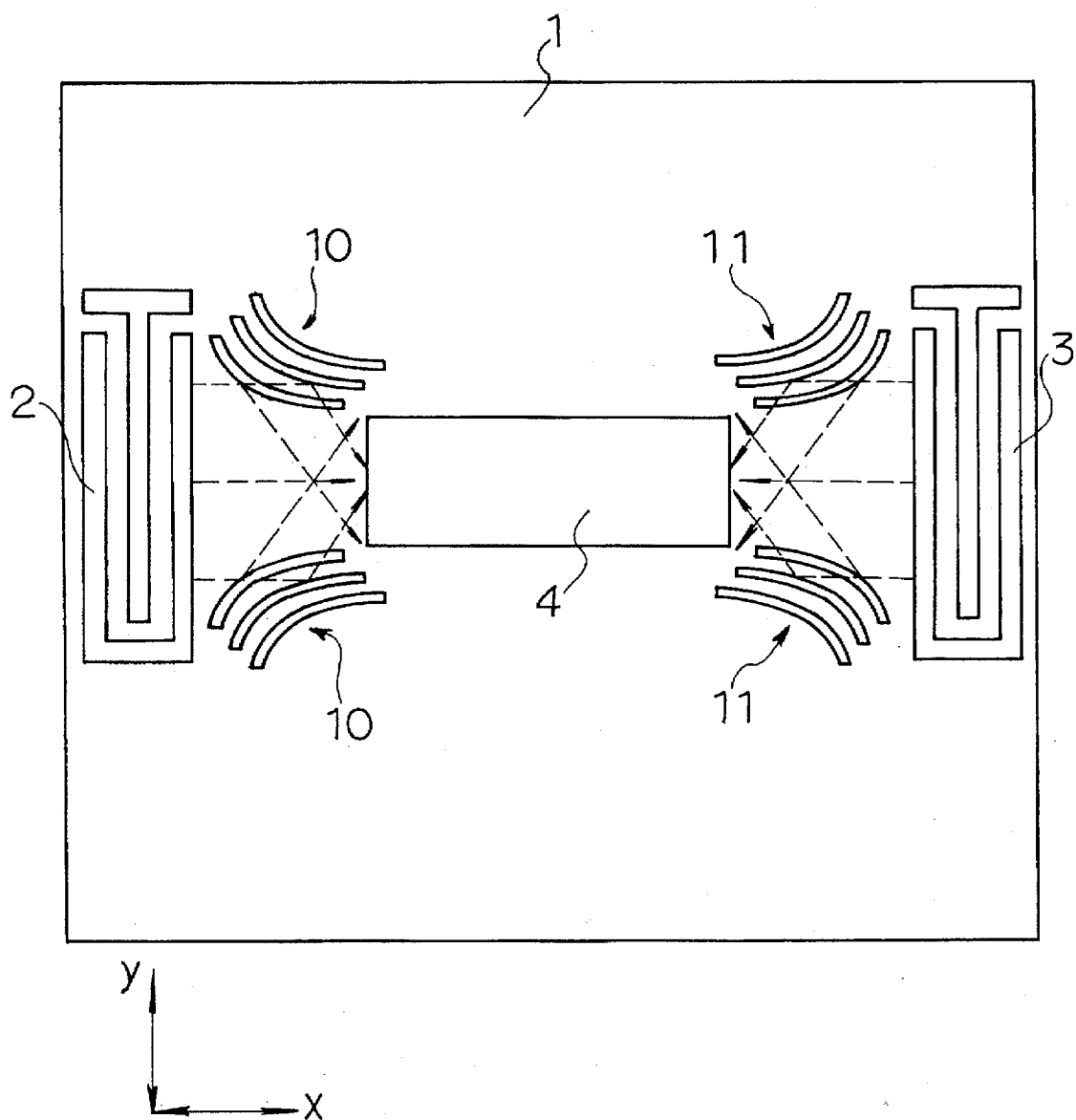
FIG. 1 is a schematic plan view showing a surface acoustic wave convolver in an aspect of the present invention.

Preferred embodiments of the present invention will now be described with reference to the accompanying drawings. Like reference numerals denote corresponding components throughout the figures for simplifying the explanation. Symbols X and Y are applied for convenience of the explanation, and they do not designate crystal axes of a substrate.

FIG. 1 is a schematic plan view showing a surface acoustic wave convolver in an aspect of the present invention. A pair of comb-like surface acoustic wave excitation electrodes 2 and 3 are disposed opposed to each other at a specified interval on a surface of a piezoelectric substrate 1. The piezoelectric substrate 1 is made, for example, of lithium niobate. The surface acoustic wave excitation electrodes 2 and 3 are made of a conductive material such as Al, Au, Ag or the like. A center electrode 4 having a shorter width ($A_2$) than a length of the excitation electrodes 2 and 3 ($A_1$) is formed between the pair of the excitation electrodes 2 and 3 (i.e., $A_1 > A_2$).

The center electrode 4 propagates surface acoustic waves respectively produced by the excitation electrodes 2 and 3 in reverse directions to each other to obtain a convolution output signal.

A pair of reflectors 10 are provided on opposite sides of a region defined between the excitation electrode 2 and one end of the center electrode 4 with a width equivalent to that of the center electrode 4 ($A_2$). Also a pair of reflectors 11 are provided on opposite sides of a region defined between the excitation electrode 3 and the other end of the center electrode 4 with a width equivalent to that of the center electrode 4.

The reflectors 10 and 11 are positioned in regions outside the width of the center electrode 4 ($A_2$) and extensions therefrom with the same width so that they can receive the surface acoustic waves generated by the excitation electrodes 2 and 3 and propagating in an X-direction in the piezoelectric substrate 1. The reflectors 10 and 11 are oriented to reflect the surface acoustic waves so that reflected waves are in phase with each other and to direct the reflected waves toward the center electrode 4. Although reflecting members constituting the reflectors 10 and 11 are all shaped in arc in this embodiment, they may be linearly shaped.

The reflecting members of the reflectors 10 and 11 are made of a conductive material such as Al, Au, Ag or the like. A width and pitch of the reflecting members are determined as λ/4 where λ is a wavelength of the surface acoustic waves. There are thirty of the reflecting members on either side. In FIG. 1, only three of them can be seen for simplification of the illustration. These conditions similarly apply other preferred embodiments described later.

Since the above-mentioned arrangement enables the reflectors 10 and 11 to reflect the surface acoustic waves from the excitation electrodes 2 and 3 toward the center electrode 4, and an incident efficiency of the surface acoustic waves upon the center electrode 4 is enhanced, an energy density of the surface acoustic waves is raised, and eventually, a convolution efficiency can be enhanced.

In addition to that, since the length of the excitation electrodes ($A_1$) can be determined as desired by virtue of the reflectors 10 and 11 which can change a beam width of the surface acoustic waves, matching of an input impedance can be facilitated.

A tilt angle of the reflecting members of the reflectors 10 and 11 may meet a condition that an incident angle $\theta$ of the surface acoustic waves is determined to satisfy $\sin\theta > v_1/v_0$ (where $v_1$ is a velocity of the surface acoustic waves in the reflectors, and $v_0$ is a velocity of the surface acoustic waves in free surface). In other words, $\theta > \sin^{-1}(v_1/v_0)$. Under such a condition, however, a distance between the center electrode 4 and the excitation electrodes 2 and 3 ($A_3$) becomes undesirably long. Hence, the incident angle $\theta$ may be larger to shorten the distance between the center electrode 4 and the excitation electrodes 2 and 3 ($A_2$) in order to further miniaturize the surface acoustic wave convolver. In such a case, also, with a sufficient number of the reflecting members as in this embodiment, the surface acoustic waves can be totally reflected toward the center electrode 4.

Figure 2:
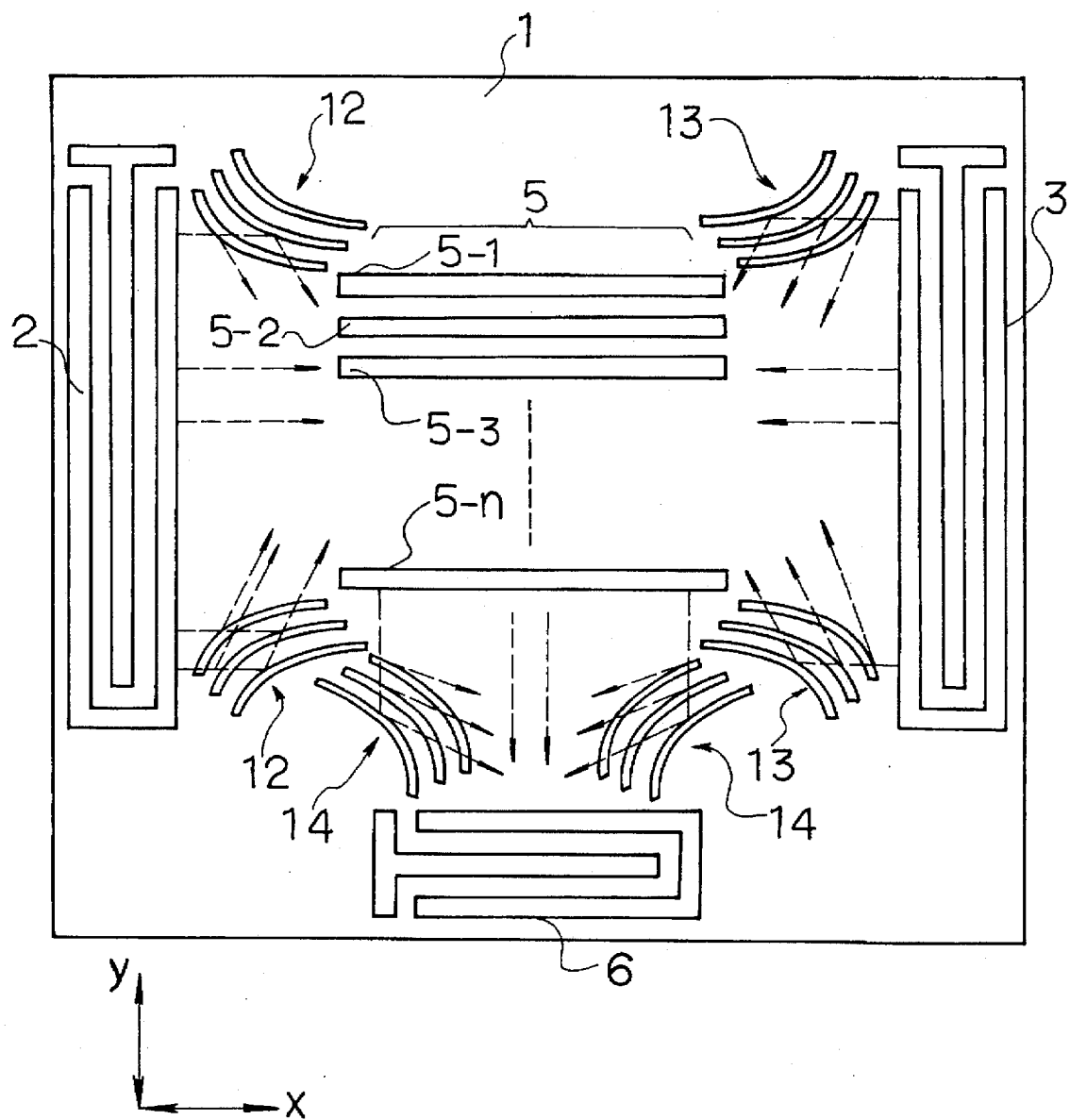
FIG. 2 is a schematic plan view showing a surface acoustic wave convolver using multiple waveguide in another aspect of the present invention.
Figure 3:
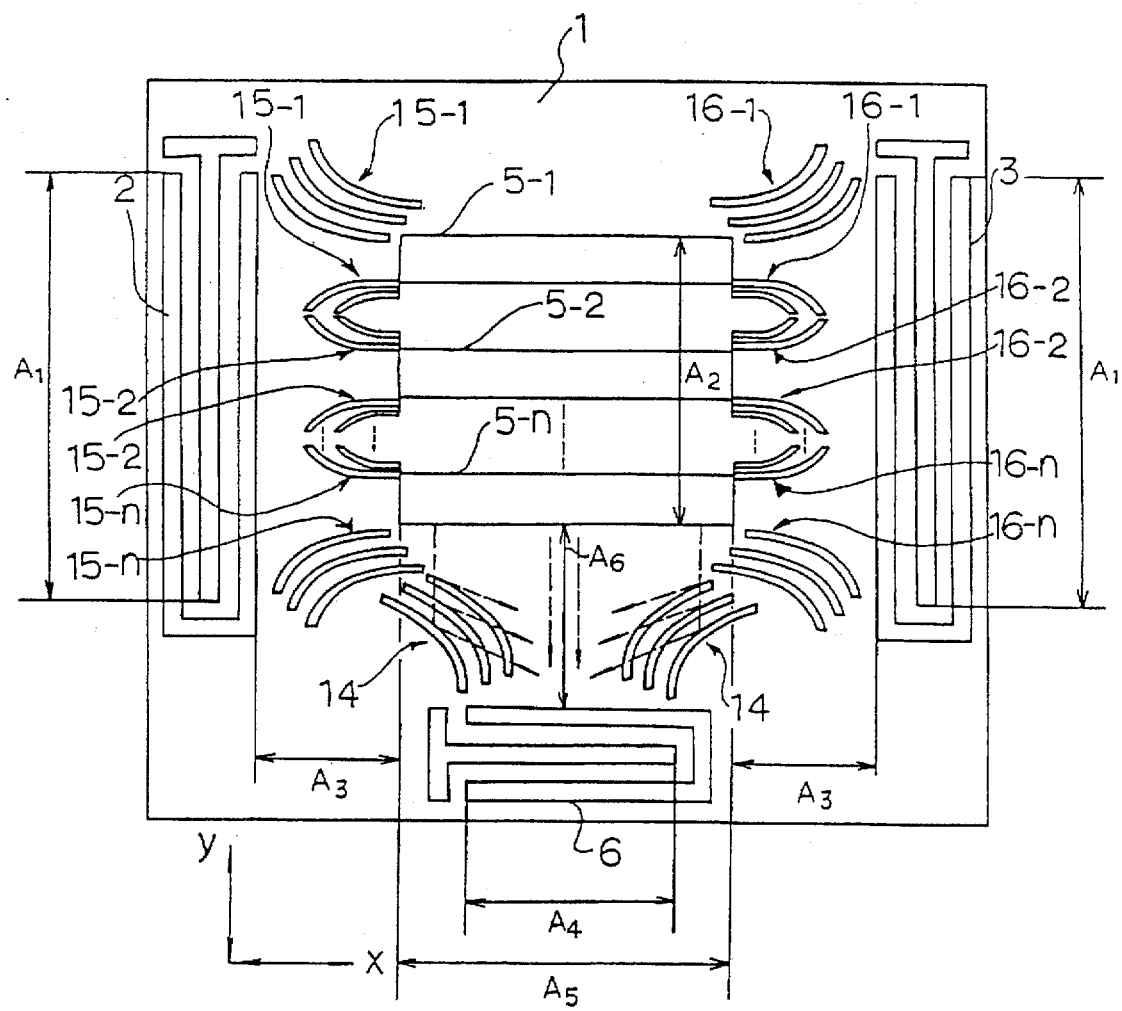
FIG. 3 is a schematic plan view showing a surface acoustic wave convolver using multiple waveguide in still another aspect of the present invention.
Figure 4:
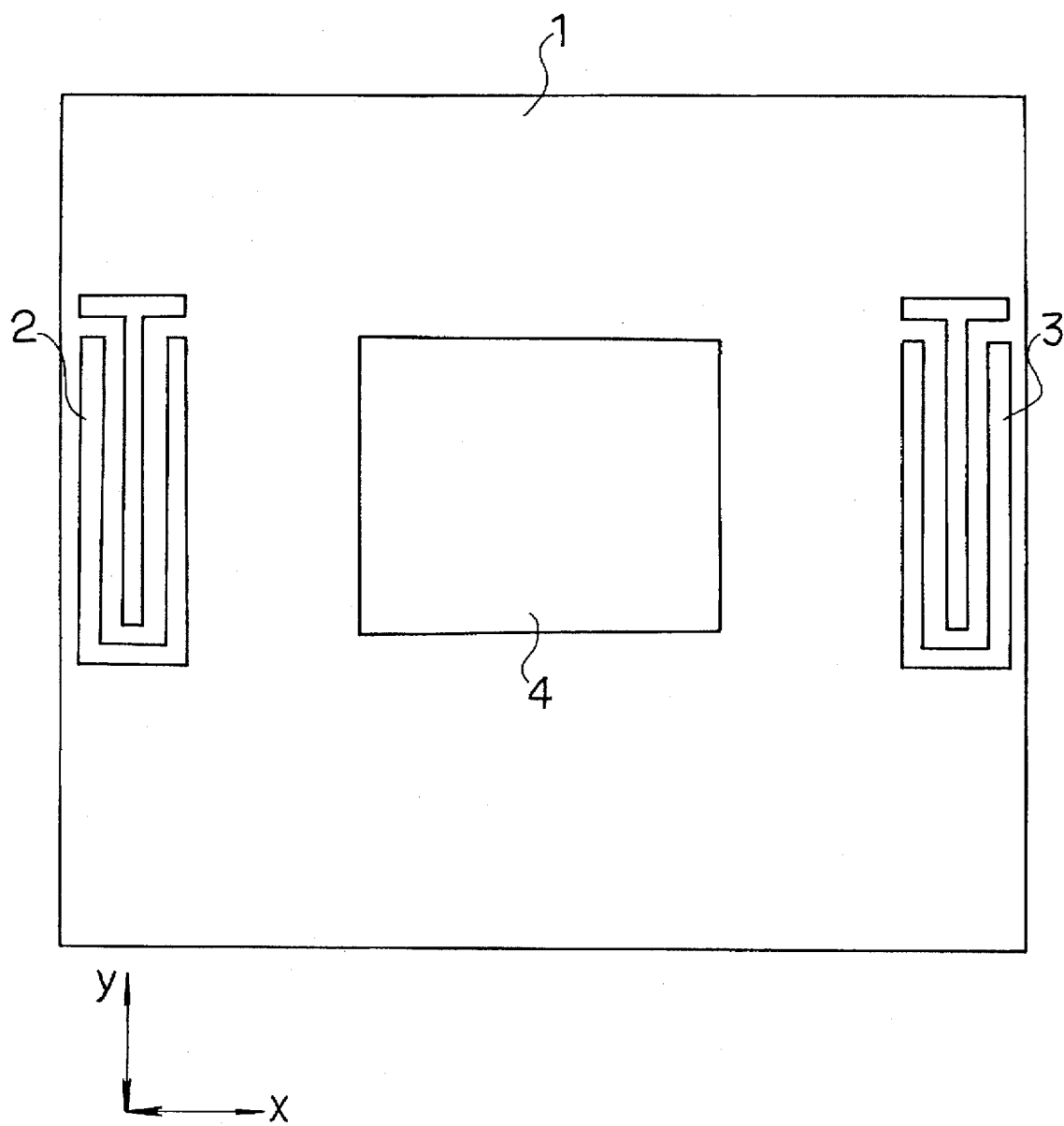
FIG. 4 is a schematic plan view showing a prior art surface acoustic wave convolver.
Figure 5:
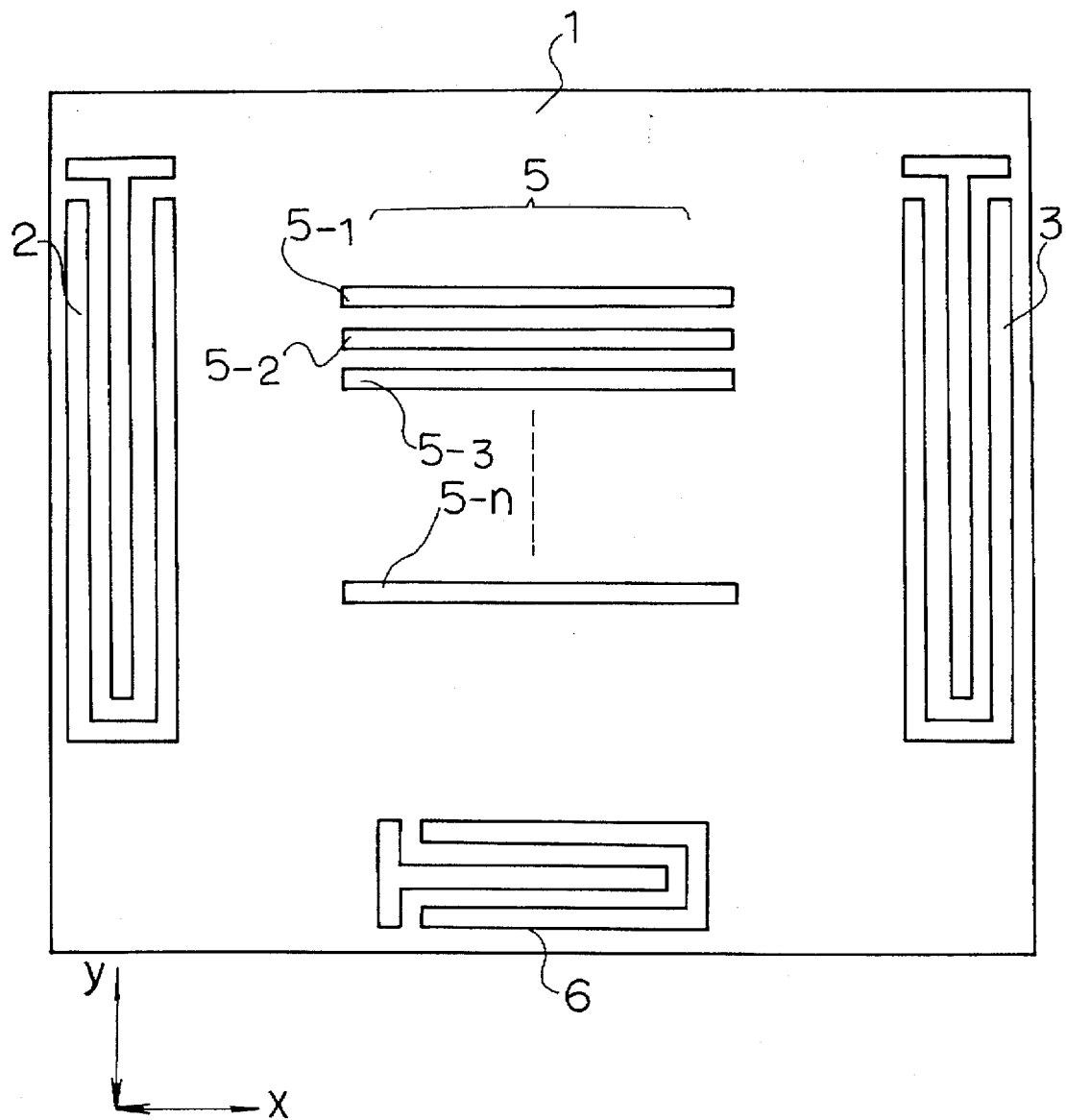
FIG. 5 is a schematic plan view showing a surface acoustic wave convolver using multiple waveguide.
Figure 6:
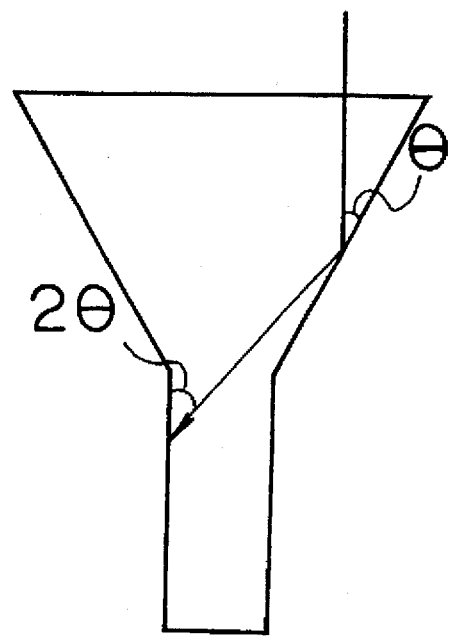
FIG. 6 is a diagram illustrating an incident angle θ in a horn-shaped waveguide.

FIG. 2 is a schematic plan view showing a surface acoustic wave convolver using multiple waveguide. A pair of comb-like surface acoustic wave excitation electrodes 2 and 3 are disposed opposed to each other at a specified interval on a surface of a piezoelectric substrate 1. The piezoelectric substrate 1 is made of lithium niobate or the like. The surface acoustic wave excitation electrodes 2 and 3 are made of a conductive material such as Al, Au, Ag or the like.

Moreover, waveguide 5 split into sub-waveguides $5_{-1}$, $5_{-2}$, ..., $5_{-n}$ (referred to as 'waveguide 5' en bloc) are arranged at specified intervals to each other between the excitation electrodes 2 and 3 on the surface of the piezoelectric substrate 1. Each waveguide $5_{-1}$, $5_{-2}$, ..., $5_{-n}$ is elongated in a direction (X-direction) orthogonal to a longitudinal extension of the excitation electrodes 2 and 3 (Y-direction). The waveguide 5 is made of a conductive material such as Al, Au, Ag or the like. The total width of the waveguide 5 ($A_2$) is smaller than the length of the excitation electrodes 2 and 3 ($A_1$).

The waveguide 5 is described in detail in "SURFACE ACOUSTIC WAVE ENGINEERING," pp. 82–102, supervised by Mikio Shibayama, published by Denshi Tsushin Gakkai or the Institute of Electronics and Communication Engineers. In this embodiment, a $\Delta V/V$ waveguide is employed in which a surface of a substrate is coated with a conductive material such as Al, Au, Ag or the like.

A comb-like output electrode 6 is formed close to the waveguide $5_{-n}$. The output electrode 6 is elongated in a direction (X-direction) orthogonal to the longitudinal extension of the excitation electrodes 2 and 3 (Y-direction). The output electrode 6 is made of a conductive material such as Al, Au, Ag or the like. The length of the output electrode 6 ($A_4$) is smaller in length than that of the waveguide 5 ($A_5$) (i.e., $A_4 < A_5$).

A pair of reflectors 12 are provided on opposite sides of a region defined between the excitation electrode 2 and one end of the waveguide 5 with a width equivalent to that of the waveguide 5 ($A_2$). Also, a pair of reflectors 13 are provided on opposite sides of a region defined between the excitation electrode 3 and the other end of the waveguide 5 with a width equivalent to that of the waveguide 5 ($A_2$). p The reflectors 12 and 13 are positioned in regions outside the width of the waveguide 5 ($A_2$) and extensions therefrom with the same width so that they can receive the surface acoustic waves which are generated by the excitation electrodes 2 and 3 and propagate in an X-direction in the piezoelectric substrate 1. The reflectors 12 and 13 are oriented to reflect the surface acoustic waves so that reflected waves are in phase with each other and to direct the reflected waves toward the waveguide 5.

Furthermore, a pair of reflectors 14 are provided on opposite sides of a region defined between the waveguide $5_{-n}$ and the output electrode 6 with a length almost the same as that of the output electrode 6 ($A_4$). More specifically, the reflectors 14 are positioned in regions outside the output electrode 6 and an extension therefrom with almost the same length as that of the output electrode 6 ($A_4$) so that they can receive the surface acoustic waves propagating in a Y-direction in the waveguide 5. The reflectors 14 are oriented to reflect the surface acoustic waves so that reflected waves are in phase with each other and to direct the reflected waves toward the output electrode 6.

Reflecting members of the reflectors 12, 13 and 14 are made of a conductive material such as Al, Au, Ag or the like. A width and pitch of the reflecting members are determined as $\lambda/4$ where $\lambda$ is a wavelength of the surface acoustic waves. There are thirty of the reflecting members. Although the reflecting members constituting the reflectors 12, 13 and 14 are shaped in arc in this embodiment, they may be linearly shaped.

Since the above-mentioned arrangement enables the reflectors 12 and 13 to reflect the surface acoustic waves from the excitation electrodes 2 and 3 toward the waveguide 5, an incident efficiency of the surface acoustic waved upon the waveguide 5 is enhanced, an energy density of the surface acoustic waves is raised, and eventually, a convolution efficiency can be enhanced.

In addition to that, since a length of the excitation electrodes can be determined as desired by virtue of the reflectors 12, 13 and 14 which can change a beam width of the surface acoustic waves, matching of an input impedance is facilitated.

Similar to the previous embodiment, with a sharper tilt angle of the reflecting members of the reflectors 12, 13 and 14 and a sufficient number of the reflectors, distances between the excitation electrodes 2 and 3 and the waveguide 5 ($A_3$) and between the waveguide 5 and the output electrode 6 ($A_6$) can be shortened, and this brings about miniaturization of the surface acoustic wave convolver.

Similar to the Embodiment 2, a surface acoustic wave convolver in this embodiment is a surface acoustic wave convolver using multiple waveguide having a plurality of waveguides, and reflectors are oriented so that surface acoustic waves from excitation electrodes 2 and 3 are reflected toward each of waveguides $5_{-1}$, $5_{-2}$, ..., $5_{-n}$.

Pairs of reflectors $15_{-1}$, $15_{-2}$, ..., $15_{-n}$ formed respectively on one ends of the waveguides $5_{-1}$, $5_{-2}$, ..., $5_{-n}$. Also, pairs of reflectors, $16_{-1}$, $16_{-2}$, ..., and $16_{-n}$, are formed respectively on the other ends of those waveguides.

Since such an arrangement enables the reflectors provided corresponding to the respective waveguides to reduce the surface acoustic wave leaking between the waveguides, a convolution efficiency can be more enhanced, compared with the arrangement described in the Embodiment 2.

Similar to the Embodiment 2, with a sharper tilt angle of reflecting members of the reflectors 15 and 16 and a sufficient number of reflectors, distances between the excitation electrodes 2 and 3 and waveguide 5 and between the waveguide 5 and an output electrode 6 can be shortened to further miniaturize the surface acoustic wave convolver.

Figure 7:
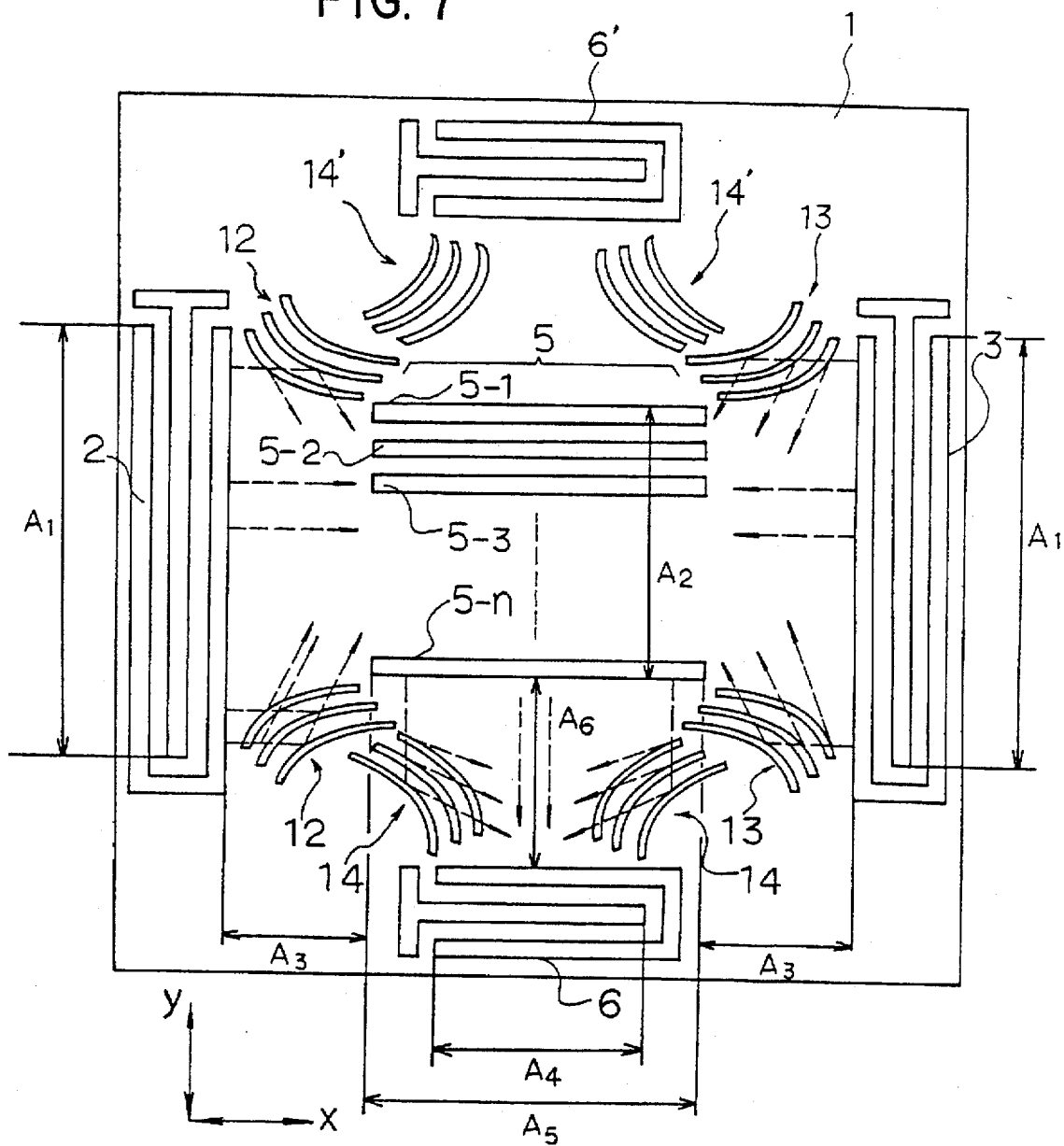
FIG. 7 is a schematic plan view showing a surface acoustic wave convolver with two output electrodes.
Figure 8:
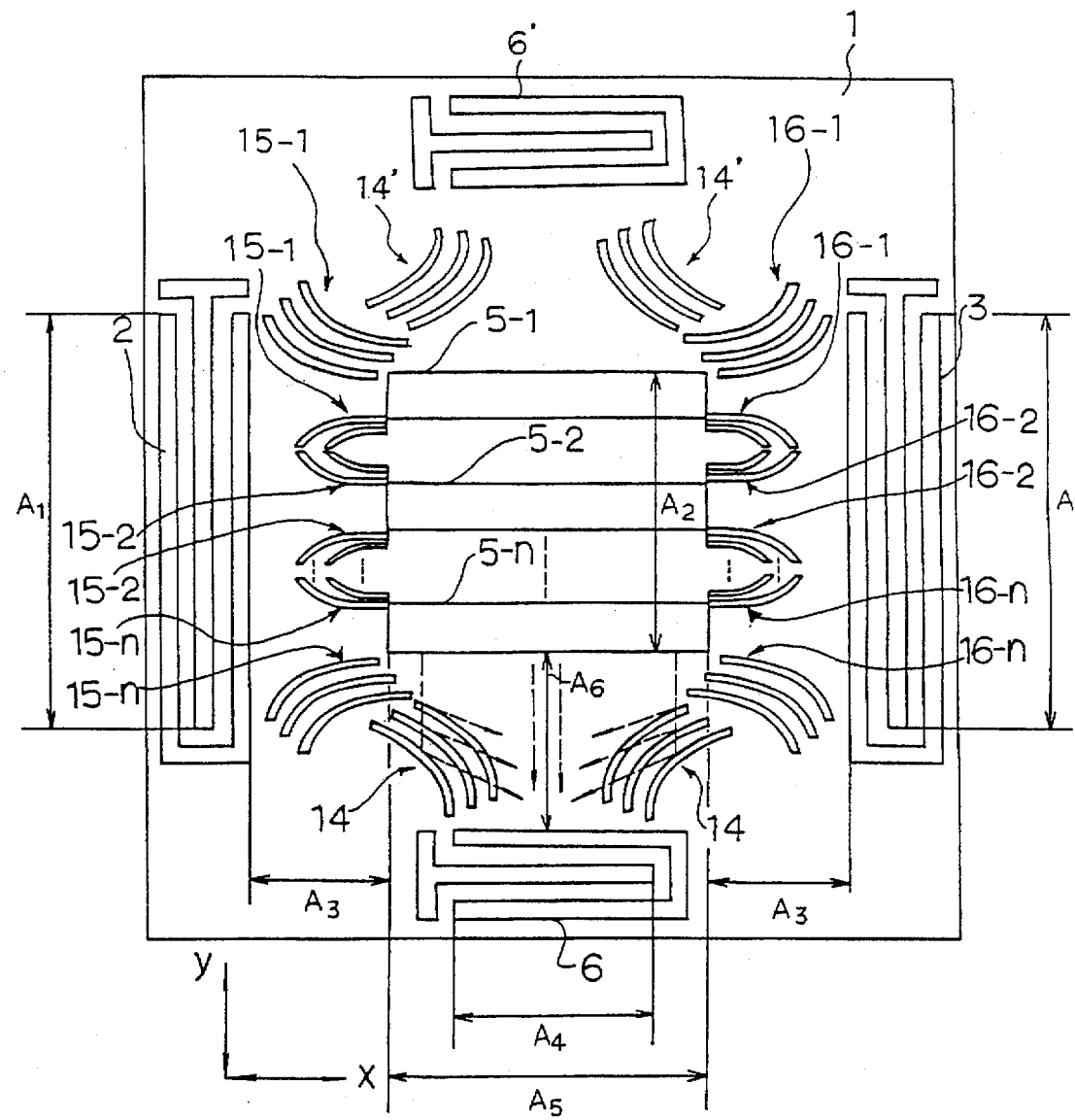
FIG. 8 is a schematic plan view showing a surface acoustic wave convolver with two output electrodes.

Although the single output electrode 6 is provided in the Embodiments 2 and 3, as shown in FIGS. 7 and 8, an additional output electrode may be provided opposed to the output electrode 6 with the waveguide 5 interposed between them, and furthermore, there may be respectively more than one excitation electrodes 2 and 3. As has been described, in accordance with the present invention, the incident efficiency of the surface acoustic waves can be enhanced with the slightest increase in area of the piezoelectric substrate.

Although the present invention has been described and illustrated in detail, it is clearly understood that the same is by way of illustration and example only and is not to be taken by way of limitation, the spirit and scope of the preset invention being limited only by the terms of the appended claims.

What is claimed is:

1. A surface acoustic wave convolver, comprising
at least two excitation electrodes for exciting surface acoustic waves,
an output electrode for detecting the surface acoustic waves from the excitation electrodes to convert a convolution output into an electric signal, and
reflector means for reflecting the surface acoustic waves from the excitation electrodes toward the output electrode so that reflected waves are in phase with each other, the reflector means reflecting the surface acoustic waves away from and exterior to the reflector means,
the excitation electrodes, the output electrode and the reflector means all being arranged on a piezoelectric substrate.

2. A surface acoustic wave convolver according to claim 1, wherein the reflector means is oriented such that an incident angle of the surface acoustic wave is larger than $$\mathrm{Sin}^{-1}\ (v1/v0)$$

where v1 is a velocity of a surface acoustic wave in the reflector means and v0 is a velocity of the surface acoustic waves on the piezoelectric surface.

3. A surface acoustic wave convolver according to claim 1, wherein the length of output electrode is smaller than the length of the excitation electrodes.

4. A surface acoustic wave convolver according to claim 1, wherein the reflector means includes a plurality of arc-shaped elements.

5. A surface wave convolver according to claim 1, wherein the reflector means includes a plurality of linearly shaped elements.

6. A surface acoustic wave convolver, comprising
at least two excitation electrodes for exciting first surface acoustic waves,
a plurality of waveguides for propagating the, first surface acoustic waves from the excitation electrodes in reverse directions to each other,
an output electrode for detecting a second surface acoustic wave which is generated at the waveguides and propagates traversing the first surface acoustic waves to convert the second surface acoustic wave into an electric signal, and
reflector means for reflecting the first surface acoustic waves from the excitation electrodes toward the waveguides so that reflected waves are in phase with each other, the reflector means reflecting the first surface acoustic waves away from and exterior to the reflector means,
the excitation electrodes, the waveguides, the output electrode and the reflector means all being arranged on a piezoelectric substrate.

7. A surface acoustic wave convolver according to claim 6, wherein the reflector means is oriented such that an incident angle of the surface acoustic wave is larger than $$\mathrm{Sin}^{-1}\ (v1/v0)$$

where v1 is a velocity of a surface acoustic wave in the reflector means and v0 is a velocity of the surface acoustic waves on the piezoelectric surface.

8. A surface acoustic wave convolver according to claim 6, wherein the width of the waveguides are smaller than the length of the excitation electrodes.

9. A surface acoustic wave convolver according to claim 6, wherein the reflector means includes a plurality of arc shaped elements.

10. A surface acoustic wave convolver according to claim 6, wherein the reflector means includes a plurality of linearly shaped elements.

11. A surface acoustic wave convolver according to claim 6, wherein there are two of the same output electrodes disposed on opposite sides of the waveguides.

12. A surface acoustic wave convolver, comprising
at least two excitation electrodes for exciting first surface acoustic waves,
a plurality of waveguides for propagating the first surface acoustic waves from the excitation electrodes in reverse direction to each other,
an output electrode for detecting a second surface acoustic wave which is generated at the waveguides and propagates traversing the first surface acoustic waves, to convert the second surface acoustic wave into an electric signal, and
reflector means arranged between at least one excitation electrode and at least one waveguide for reflecting the first surface acoustic waves from the excitation electrodes toward each waveguide so that reflected waves are in phase with each other, the reflector means reflecting the first surface acoustic waves away from and exterior to the reflector means,
the excitation electrodes, the waveguides, the output electrode and the reflector means all being arranged on a piezoelectric substrate.

13. A surface acoustic wave convolver according to claim 12, wherein the reflector means is oriented such that an incident angle of the surface acoustic wave is larger than $$\mathrm{Sin}^{-1}\ (v1/v0)$$

where v1 is a velocity of a surface acoustic wave in the reflector means and v0 is a velocity of the surface acoustic waves on the piezoelectric surface.

14. A surface acoustic wave convolver according to claim 12, wherein the width of the waveguides are smaller in width than the length of the excitation electrodes.

15. A surface acoustic wave convolver according to claim 12, wherein the reflector means includes a plurality of arc shaped elements.

16. A surface acoustic wave convolver according to claim 12, wherein the reflector means includes a plurality of linearly shaped elements.

17. A surface acoustic wave convolver according to claim 12, wherein there are two of the same output electrodes disposed on opposite sides of the waveguides.

18. A surface acoustic wave convolver, comprising at least two excitation electrodes for exciting first surface acoustic waves, a plurality of waveguides for propagating the first surface acoustic waves from the excitation electrodes in reverse directions to each other, an output electrode for detecting a second surface acoustic wave which is generated at the waveguides and propagates traversing the first surface acoustic waves to convert the second surface acoustic wave into an electric signal, and reflector means for reflecting the second surface acoustic wave from the waveguides toward the output electrode so that reflected waves are in phase with each other, the reflector means reflecting the second surface acoustic wave away from and exterior to the reflector means, the excitation electrodes, the waveguides, the output electrodes and the reflector means all being arranged on a piezoelectric substrate.

19. A surface acoustic wave convolver according to claim 18, wherein the reflector means is oriented such that an incident angle of the surface acoustic wave is larger than $$\sin^{-1}(v1/v0)$$

where v1 is a velocity of a surface acoustic wave in the reflector means and v0 is a velocity of the surface acoustic waves on the piezoelectric surface.

20. A surface acoustic wave convolver according to claim 18, wherein the length of the output electrode is smaller than the waveguides.

21. A surface acoustic wave convolver according to claim 18, wherein the reflector means includes a plurality of arc shaped elements.

22. A surface acoustic wave convolver according to claim 18, wherein the reflector means includes a plurality of linearly shaped elements.

23. A surface acoustic wave convolver according to claim 18, wherein there are two of the same output electrodes disposed on opposite sides of the waveguides.

* * * * *